United States Patent
Jung et al.

(10) Patent No.: US 7,478,310 B2
(45) Date of Patent: Jan. 13, 2009

(54) PROGRAMMABLE ERROR CORRECTING DEVICE

(75) Inventors: Joon-Young Jung, Daejon (KR); O-Hyung Kwon, Daejon (KR); Soo-In Lee, Daejon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 558 days.

(21) Appl. No.: 11/318,627

(22) Filed: Dec. 28, 2005

(65) Prior Publication Data

US 2007/0011585 A1 Jan. 11, 2007

(30) Foreign Application Priority Data

Jul. 5, 2005 (KR) .................... 10-2005-0060382

(51) Int. Cl.
*H03M 13/00* (2006.01)
(52) U.S. Cl. ...................................... 714/784
(58) Field of Classification Search .............. 714/746, 714/784, 786
See application file for complete search history.

(56) References Cited

U.S. PATENT DOCUMENTS 5,051,999 A * 9/1991 Erhart et al. ............ 714/774
6,385,751 B1 * 5/2002 Wolf ........................ 714/784
6,631,488 B1 * 10/2003 Stambaugh et al. ......... 714/746

FOREIGN PATENT DOCUMENTS

| JP | 11-346157 | 12/1999 |
|---|---|---|
| JP | 2000-209102 | 7/2000 |
| KR | 1020000005785 | 1/2000 |

OTHER PUBLICATIONS

Wolf, Tod, A DSP Reed Solomon coder, 1999, IEEE Custom integrated circuits conference.*

* cited by examiner

*Primary Examiner*—Shelly A Chase
(74) *Attorney, Agent, or Firm*—Lowe Hauptman Ham & Berner, LLP

(57) ABSTRACT

A programmable error correcting device is disclosed. The programmable error correcting device includes a controller for receiving information about a length of a codeword, an error correcting capacity, whether of not a shortened codeword mode is supported and a total byte number of burst data and outputting a control signal; a preprocessor for dividing input information data by a length of information byte in a codeword and outputting the divided input information data with a valid data indicating signal in response to the control signal input from the controller for an error correcting coding; and a coder for deciding a structure for an error correcting encoding according to the control signal inputted from the controller and performing an error correcting encoding on information data inputted from the preprocessor according to the decided structure.

12 Claims, 6 Drawing Sheets

PROGRAMMABLE ERROR CORRECTING DEVICE

FIELD OF THE INVENTION

The present invention relates to a programmable error correcting device; and, more particularly, to a programmable error correcting device having a variable circuit structure according to an error correcting capacity, a length of a codeword and a shortened codeword mode in a cable modem employing a data-over-cable service interface specification (DOCSIS) 2.0.

DESCRIPTION OF RELATED ARTS

A cable modem generally requires an error correcting coding for restoring a data from data error generated in a transmission channel when a burst data is transmitted to a head-end through an uplink channel. A Reed-Solomon (RS) code is defined as an error correcting coding scheme for the uplink channel in a data-over-cable service interface specification (DOCSIS) which is an international standard for cable data communication.

The RS code is generally called a (n, k) coding, where n denotes a length of a RS codeword and k denotes a length of information data included in the codeword. Herein, the length denotes the number of symbols used in the RS coding. Generally, the RS coding symbol is expressed using several bits, and it assumes that one symbol is expressed with 8 bit data, that is, one byte, to describe the present invention as well as the related prior art thereof.

The (n, k) coding means that k bytes of information data are inputted and an n byte of RS codeword are outputted. If channel error is generated in the n bytes of RS codeword less than t bytes, the generated channel error can be corrected. Herein, t denotes an error correcting capacity and is calculated by an equation, $2t=n-k$.

In order to correct an error generated in an uplink channel, the DOCSIS requires a RS coder to have following functions. An encoding function must be turned on or off according to a control signal inputted from a medium access control (MAC) layer. A circuit structure of the RS coder must be changed according to a range of error correcting capacity, for example, 1 to 16. Also, the circuit structure of the RS coder must be changed according to the length of the RS codeword in a predetermined range, for example, 16 to 255 bytes.

In other words, a RS coding scheme for the uplink channel required in the DOCSIS must be programmable according to values of n and t which vary in the predetermined range. The values of n are in a range of 18 to 255, and the values of t are in a range of 1 to 16. Also, the RS coding scheme must be capable of processing a last RS codeword having variable length according to whether or not a shortened codeword mode is supported.

In a cable communication system, the values of t and n and the shortened codeword mode are defined in a burst profile in an upstream channel descriptor (UCD) message that is transmitted from a head-end of cable modem termination system (CMTS) to each cable modem. That is, the cable modem prepares the RS coding according to values defined in the burst profile in the received UCD message before transmitting data.

Therefore, a RS coder must be embodied to have variable structure to perform the RS coding according to the values of n and t and the shortened codeword mode defined in the burst profile in the upstream channel descriptor (UCD).

FIG. 1 is a circuit diagram of a RS coder in accordance with the related art.

As shown in FIG. 1, the conventional RS coder has a variable structure decided according to an error correcting capacity t.

At first, k bytes of information data are inputted to the RS coder one by one byte. The RS coder outputs the input data and updates a value of a resistor 101 by feeding back the data to a Galois Field (GF) multiplier 102 at the same time. Then, values stored in 2t resistors 101 are outputted in sequence after inputting and outputting the all k bytes of information data.

FIG. 2 is a time diagram showing operations of the conventional RS coder shown in FIG. 1.

As shown in FIG. 2, the conventional RS coder receives k bytes of information data and outputs the n bytes of RS codewords. Also, an n byte of RS codeword is configured of a k byte of information data and 2t bytes of parity data.

However, the conventional RS coder must have resistors 101 and GF multipliers 102 as many as two times of the value t. Also, a value of g 103 that is a coefficient of a generator polynomial inputted to the GF multiplier 102 must vary according to the value of t.

Therefore, the conventional RS coder must have different structures according to the value of t in DOCSIS 2.0. Such a requirement enlarges the hardware size of the conventional RS coder.

Also, the structure of the conventional RS coder becomes more complicated to vary the length of the codeword according to the value of n and to change the length of the last codeword according to whether the shortened codeword mode is supported or not.

Therefore, there is great demand of a RS coder having a programmable structure according to the values of n and t, and according to whether the shortened codeword mode is supported or not.

SUMMARY OF THE INVENTION

It is, therefore, an object of the present invention to provide a programmable error correcting device having a variable circuit structure according to an error correcting capacity, a length of a codeword and whether or not a shortened codeword mode is supported.

In accordance with an aspect of the present invention, there is provided including: a controller for receiving information about a length of a codeword, an error correcting capacity, whether of not a shortened codeword mode is supported and a total byte number of burst data and outputting a control signal; a preprocessor for dividing input information data by a length of information byte in a codeword and outputting the divided input information data with a valid data indicating signal in response to the control signal input from the controller for an error correcting coding; and a coder for deciding a structure for an error correcting encoding according to the control signal inputted from the controller and performing an error correcting encoding on information data inputted from the preprocessor according to the decided structure.

BRIEF DESCRIPTION OF THE DRAWINGS

The above and other objects and features of the present invention will become better understood with regard to the following description of the preferred embodiments given in conjunction with the accompanying drawings, in which.

DETAILED DESCRIPTION OF THE INVENTION

Hereinafter, a programmable error correcting device will be described in more detail with reference to the accompanying drawings.

Figure 3:
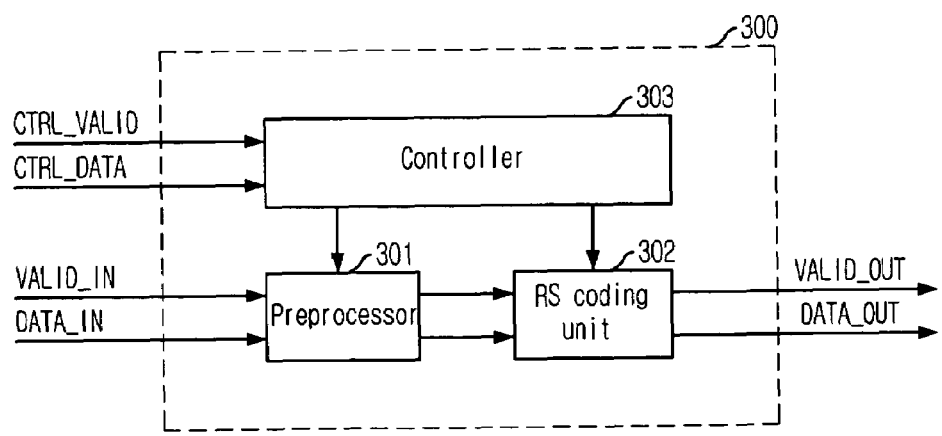
FIG. 3 is a block diagram illustrating a programmable error correcting device using a programmable Reed-Solomon code in accordance with a preferred embodiment of the present invention.

FIG. 3 is a block diagram illustrating a programmable error correcting device using a programmable Reed-Solomon code in accordance with a preferred embodiment of the present invention.

As shown in FIG. 3, the programmable error correcting device 300 using the programmable Reed-Solomon code according to the present embodiment includes a preprocessor 301, a Reed-Solomon (RS) coding unit 302 and a controller 303.

The controller 303 receives a control signal from a medium access control (MAC) layer. The control signal includes information about a value of t, a value of n and whether or not a shortened codeword mode defined in a burst profile of an UCD message and the total number of bytes of a burst data to be transmitted. The controller 303 controls the preprocessor 301 and the RS coding unit 302 according to the received control signal.

The controller 303 obtains the number of information bytes in a codeword (k=n−2t) from the defined values of n and t in the control signal. Then, the controller 303 calculates the total number M of entire codewords to be coded by dividing the total number of burst data to be transmitted by the value of k. Herein, if the total number M of entire codewords is not an integer number, that is, if the number of information data to be included in a last codeword, i.e., $M^{th}$ codeword is smaller than k, the length of the last codeword varies according to whether the shortened codeword mode is supported or not.

For example, the length of the last codeword must be n bytes if a fixed codeword mode is supported. In this case, the number of bytes of information data in the last codeword is smaller than k, zero values, i.e., 0×00, are inserted to make a k-byte long information data.

On the contrary, if the shortened codeword mode is supported, the length of the last codeword may be n'-byte long. Herein, a value of n' is a value obtained by dividing the total number of bytes in the burst data to be transmitted by k. That is, the value of n' is one in a range of 18 to 255 bytes and is smaller than the value of n.

If a value of k' is defined by k'=n'−2t, the value of k' must be larger than the number of bytes of information data to be included in a last codeword. That is, information data shorter than k' bytes must be changed to a k'-byte long information data by inserting zero values, i.e., 0×00 in the information data shorter than k' byte long. The described differences are shown in FIG. 4.

Figure 4:
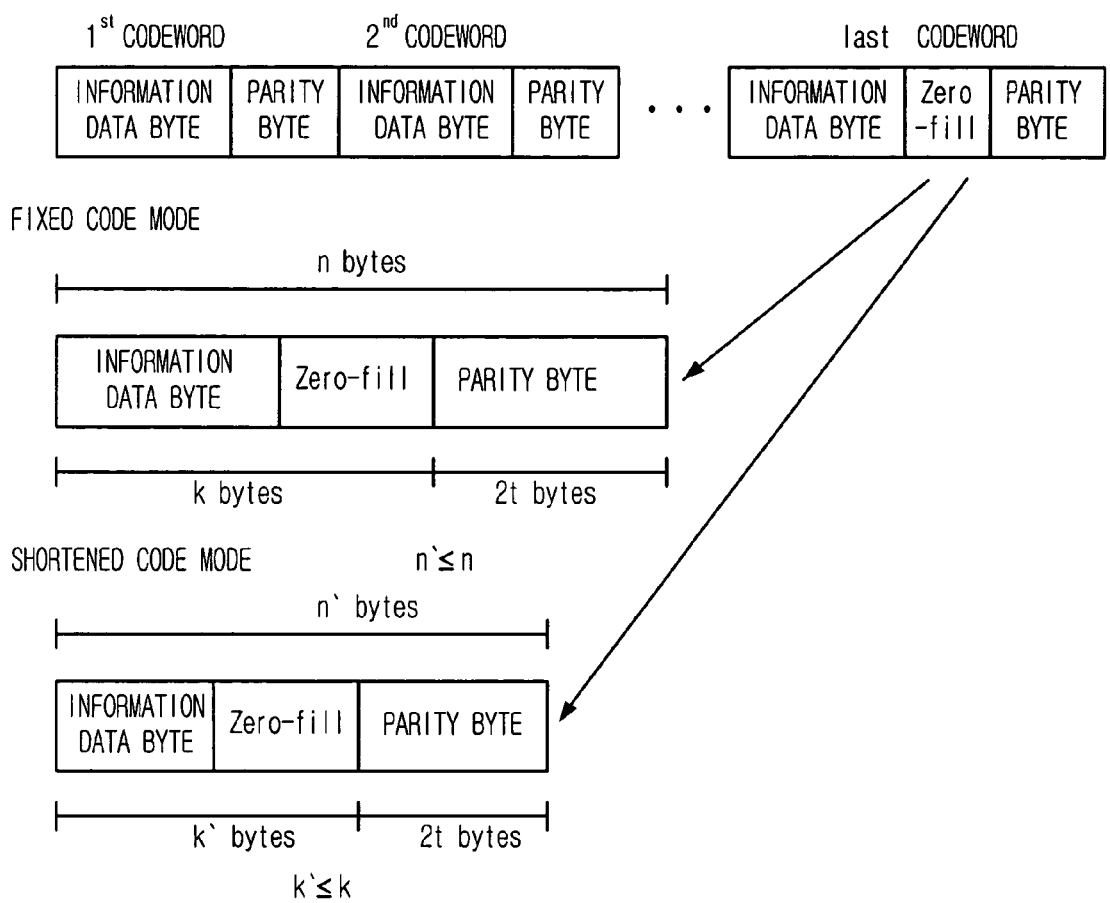
FIG. 4 is a view for explaining a fixed codeword mode and a shortened codeword mode in a RS coder in accordance with a preferred embodiment of the present invention.

FIG. 4 is a view for explaining a fixed codeword mode and a shortened codeword mode in a RS coder in accordance with a preferred embodiment of the present invention.

As shown in FIG. 4, the RS coder according to the present embodiment generates and outputs k-byte long information data by inserting zero bytes in the information data of the last codeword for the fixed codeword mode. On the contrary, the RS coder according to the present invention generates k'-byte long information data by filing zero bytes in the information data of the last codeword. Herein, the value of k' is smaller or equal to the value of k.

Figure 5:
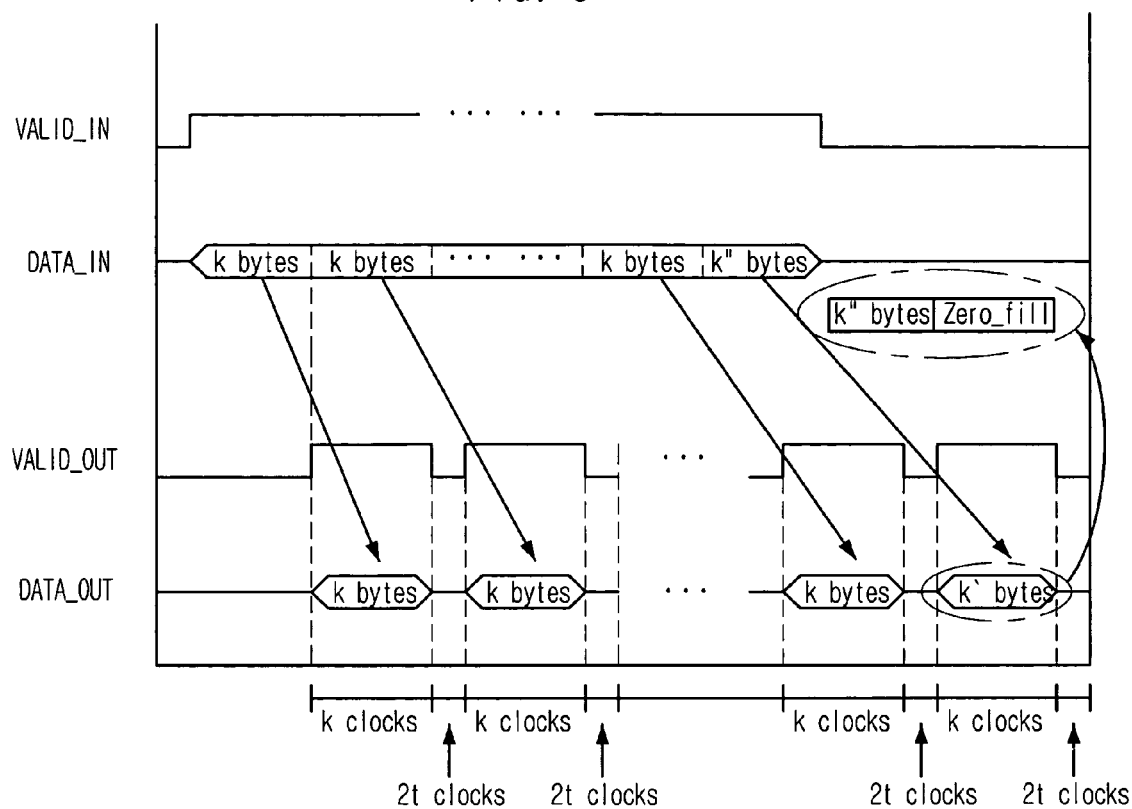
FIG. 5 is a timing diagram illustrating operations of the preprocessor 301 shown in FIG. 3.

The preprocessor 301 divides the information data (DATA_IN) into divided information data having a predetermined length as shown in FIG. 5 according to the control signal inputted from the controller 303, and transfers the divided information data to the RS coding unit 302 with a valid data indicating signal (VALID_OUT). Herein, the valid data indicating signal (VALID_OUT) denotes a period to output valid data.

The RS coding unit 320 performs a Reed-Solomon (RS) coding according to the valid data indicating signal (VALID_OUT) transferred from the preprocessor 301.

When the valid data indicating signal (VALID_OUT) is '1', the RS coding unit 302 outputs the input data as output data and updates 2t internal registers by feeding backing the input data. On the contrary, the RS coding unit 302 outputs values stored in the 2t registers in sequence when the valid data indicating signal (VALID_OUT) is 0.

As described above, the programmable error correcting device 300 controls the valid data indicating signal (VALID_OUT) in order to support the shortened codeword mode. As shown in FIG. 5, the preprocessor 301 divides the input information data (DATA_IN) by k bytes and outputs k-byte long divided information data.

FIG. 5 is a timing diagram illustrating operations of the preprocessor 301 shown in FIG. 3.

Figure 1:
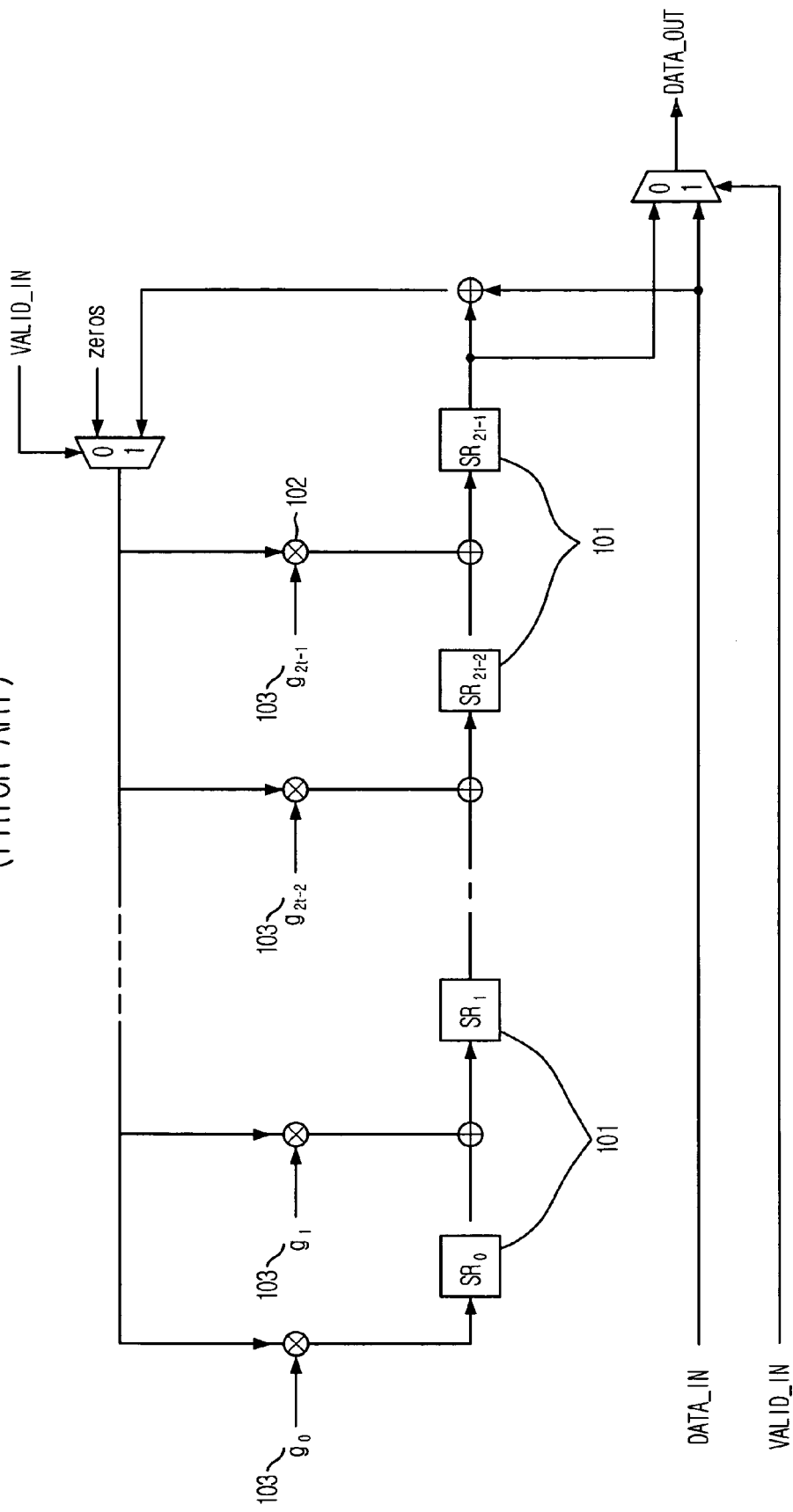
FIG. 1 is a circuit diagram of a RS coder in accordance with the related art.
Figure 2:
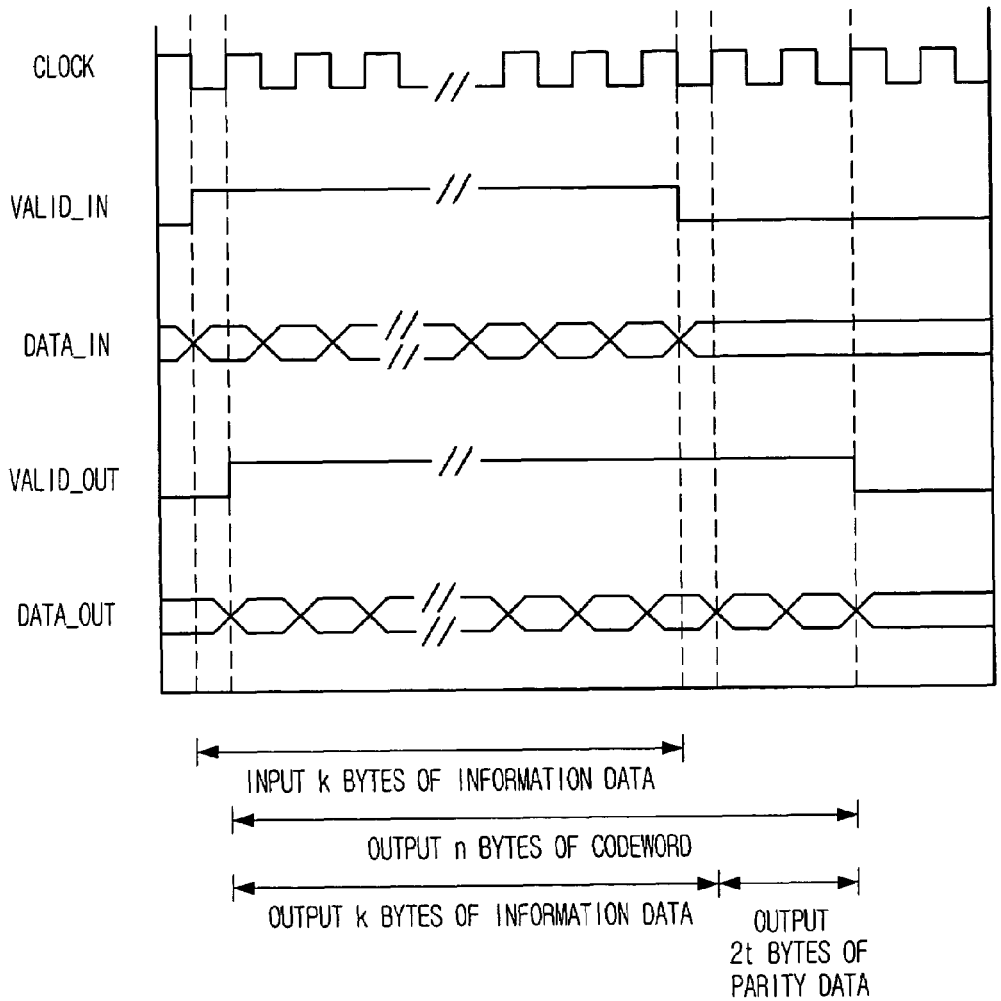
FIG. 2 is a time diagram showing operations of the conventional RS coder shown in FIG. 1.

Referring to FIG. 5, the preprocessor 301 outputs k bytes of data for k clocks by outputting one byte per one clock. Then, the preprocessor 301 does not output any data for 2k clocks and then the preprocessor 301 outputs k bytes of data for k clocks, again. The 2k clock period is a minimum time for outputting 2t bytes of parity data that is error correcting code in the RS coding unit 302. That is, the RS coding unit 302 outputs 2t bytes of parity data while the preprocessor 301 are not outputting any data for 2k clocks. It is also shown in FIG. 2.

As shown in FIG. 5, a length of the last output data from the preprocessor 310 is k'-byte long. It is the output characteristics of the programmable error correcting device 300 according to the present invention when the shortened codeword mode is supported. That is, the programmable error correcting device 300 generates a k' bytes of last information data by filling zero value, i.e., 0×00, into a k" bytes of last information data and outputs the k' bytes of last information data.

In order to generate the k' bytes of last information data, the preprocessor 301 uses control information for the total number of RS codewords and the value of k' inputted from the controller 303. That is, the preprocessor 301 divides the input data by k and counts the outputting of data when the divided data is outputted. Then, if the count value is the total number of the RS codewords, the preprocessor 301 determines that the inputted data is the last data. Then, the preprocessor 301 inserts zero values in k" byte of last information data to make the k" byte of last information into the k' byte of information data and outputs the k' byte of last information data.

If the shortened codeword mode is not supported, the preprocessor 301 inserts zero values into the k" byte of last information data to make the k" byte of last information data into k bytes of information data instead of k' byte of information data. If the last input data is k' or k byte-long, the preprocessor 302 does not fill zero values.

The RS coding unit 302 decides a structure for the RS coding according to the control signal received from the controller 303, and performs the RS coding according to the information data inputted from the preprocessor 301.

Figure 6:
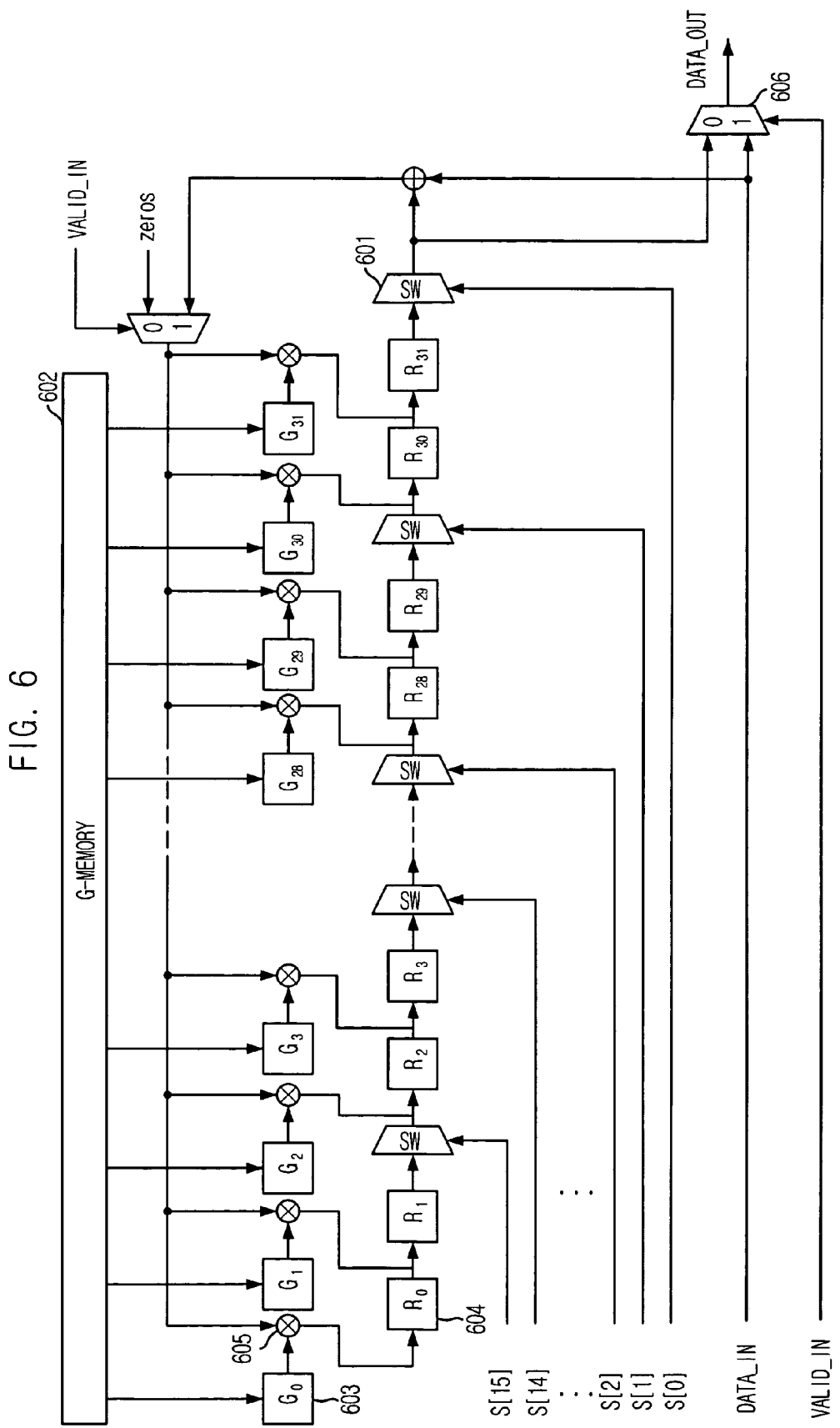
FIG. 6 is a circuit diagram illustrating the RS coding unit 302 of the programmable error correcting device 300 in accordance with a preferred embodiment of the present invention.

FIG. 6 is a circuit diagram illustrating the RS coding unit 302 of the programmable error correcting device 300 in accordance with a preferred embodiment of the present invention.

Referring to FIG. 6, the RS coding unit 302 includes: a G-memory 602 for storing coefficient values of generator polynomial according to an error correcting capacity t; 32 G-resistors G0, G1, ..., G31 603 for receiving the coefficient values according to the error correcting capacity from the G-memory 602 and inputting the received coefficient values in the GF multiplier 605; a GF multiplier 605 for multiplying the coefficient value of generator polynomial inputted from the G-registers 603 and the information data (DATA_IN) inputted from the preprocessor 301 and outputting the multiplying result; 16 switches 601 for turning on/off the R-resistors according to a control signal from the controller 303 to vary a circuit structure according to the error correcting capacity; and a multiplexer 606 multiplexing an error correcting code outputted from the R-resistors 604 and the k byte of information data in a codeword transferred from the preprocessor 301 according to the valid data indicating signal (VALID_IN) inputted from the preprocessor 301.

The RS coding unit 302 configures a circuit by receiving a 16bit control signal representing the error correcting capacity inputted from the controller 303 to perform the RS coding. Herein, the 16bits of control signal S[15, 14, ..., 1, 0] includes is from a lowest bit according to the value of t. For example, if the value of t is 2, the control signal is "0000 0000 0000 0011". If the value of t is 10, the control signal is "0000 0011 1111 1111."

The control signal S[15, ..., 0] is connected to the 16 switches 601 as shown in FIG. 6. If the switches 601 receive a control bit having a value '1', the switches 601 are turned on. On the contrary, if the switches 601 receive a control bit 0, the switches 601 are turned off. For example, if the value of t is 2, the control signal is "0000 0000 0000 0011" and accordingly, the leftmost two switches are turned on and other switches are turned off according to the control signal.

As described above, the RS coding unit 302 supports the error correcting capacity t in a range of 1 to 16. In order to turn off all the switches 601, the 16 bit of the control signal having all '0's is inputted.

The G-memory 602 varies the coefficient value of generator polynomial inputted to the GF multiplier 605 according to the error correcting capacity t. The G-memory 602 stores all coefficient values of generator polynomial for the error correcting capacity t and outputs the coefficient values to corresponding G-registers 603 according to the error correcting capacity t inputted from the controller 303.

For example, if the value of t is 2, the G-memory 602 reads corresponding coefficients g0, g1, g2 and g3 and inputs the read values into the G-resistors G28, G29, G30 and G31. The configured circuit of the RS coding unit 302 is not changed until the other command is received from the MAC layer.

The R-resistor values 604 are updated for k clocks to input data, and the k bytes of information data (DATA_IN) are outputted in order. While 2t clocks for inputting no data, the stored values in the R-resistors 604 are outputted in order.

Figure 7:
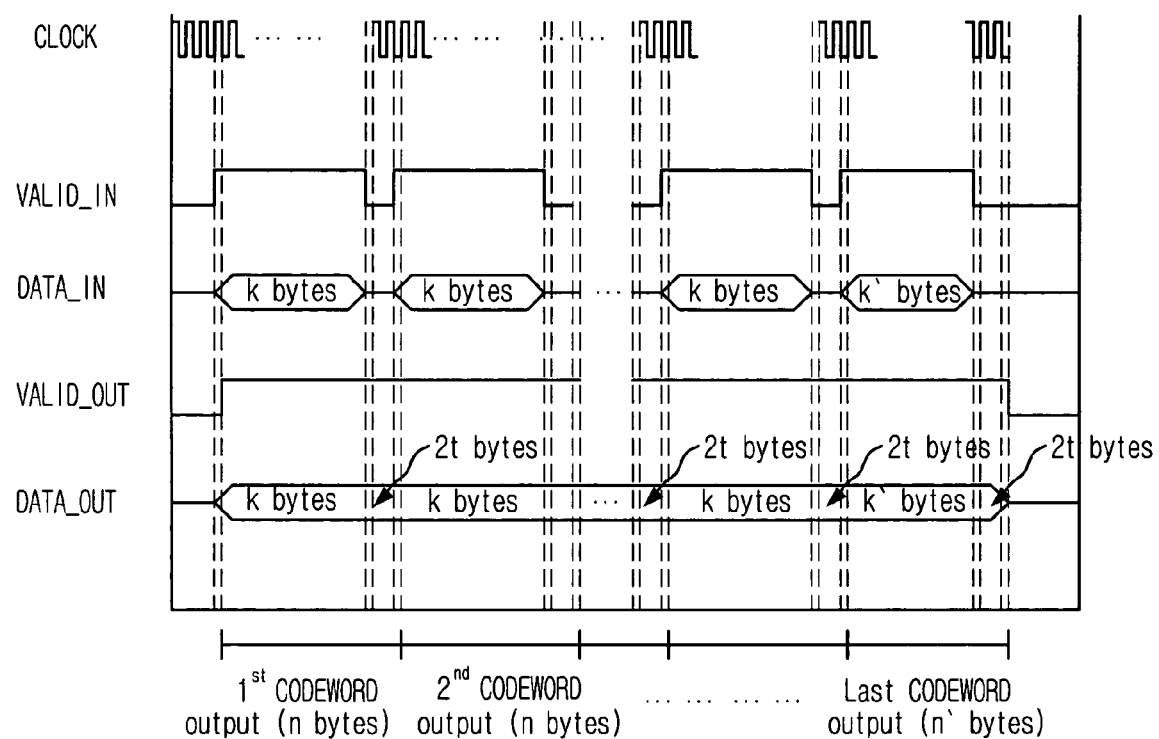
FIG. 7 is a timing diagram showing input data and output data of the RS coding unit 302 shown in FIG. 3.

FIG. 7 is a timing diagram showing input data and output data of the RS coding unit 302 shown in FIG. 3.

As shown in FIG. 7, the RS coding unit 302 performs the RS coding on k bytes of information data inputted from the preprocessor 301 and outputs n bytes of RS codeword (k+2t byte). If the shortened codeword mode is supported, the RS coding unit 302 outputs an n'-bytes of the last codeword.

As described above, the programmable error correcting device can change the internal structure according to the error correcting capacity, the length of the codeword and the shorted codeword mode. Therefore, the various error correcting coding schemes can be dynamically achieved using the single programmable error correcting device according to the present invention.

The present application contains subject matter related to Korean Patent Application No. KR 2005-0060382, filed in the Korean patent office on Jul. 5, 2005, the entire contents of which being incorporated herein by reference.

While the present invention has been described with respect to certain preferred embodiments, it will be apparent to those skilled in the art that various changes and modifications may be made without departing from the spirits and scope of the invention as defined in the following claims.

What is claimed is:

1. A programmable error correcting device, comprising:
   a controlling means for receiving information about a length of a codeword, an error correcting capacity, whether of not a shortened codeword mode is supported and a total byte number of burst data and outputting a control signal;
   a preprocessing means for dividing input information data by a length of information byte in a codeword and outputting the divided input information data with a valid data indicating signal in response to the control signal input from the controlling means for an error correcting coding; and
   a coding means for deciding a structure for an error correcting encoding according to the control signal inputted from the controlling means and performing an error correcting encoding on information data inputted from the preprocessing means according to the decided structure.

2. The programmable error correcting device as recited in claim 1, wherein the coding means decides a structure for error correcting coding in response to a control signal inputted from the controlling means and performs a Reed-Solomon coding on information data inputted from the preprocessing means.

3. The programmable error correcting device as recited in claim 2, wherein the controlling means generates an error correcting capacity control signal to change a circuit structure of the encoding means using a valid error correcting capacity t transferred from the medium access control layer.

4. The programmable error correcting device as recited claim 3, wherein the encoding means includes:
   a storing means for storing coefficient values of generator polynomial according to the error correcting capacity t;
   a first register group for reading generated coefficients values from the storing means corresponding the error correcting capacity control signal inputted from the control means;

multiplying means for multiplying the coefficient values read from the first register group and information data inputted from the preprocessing means, and outputting the error correcting code;

a second register group for temporally storing the output of the multiplying means and outputting the stored values;

a switch group for changing a circuit structure by turning on and off corresponding registers in the second register group according to the error correcting capacity control signal inputted from the controlling means; and multiplexing means for multiplexing the information data inputted from the preprocessing means according to a valid data indicating signal inputted from the preprocessing means and the corresponding error correcting codeword outputted from the second register group.

5. The programmable error correcting device as recited in claim 4, wherein the multiplexing means outputs information data transferred from the preprocessing means according to a first valid data indicating signal (VALID_OUT) inputted from the controlling means and updates the values of the second register group by feeding back to the multiplying means, outputting the values stored in the second register group according to a second valid data indicating signal (VALID_OUT) inputted from the controlling means in sequence.

6. The programmable error correcting device as recited in claim 5, wherein the valid data indicating signal outputted from the preprocessing means includes repetition of a signal period of outputting the first valid data indicating signal '1' while outputting the divided information data and other signal period of outputting the second valid data indicating signal '0' for outputting the error correcting codeword.

7. The programmable error correcting device as recited in claim 4, wherein the switch group maintains a current circuit structure until the programmable error correcting device receives a modification command from the medium access control layer.

8. The programmable error correcting device as recited in claim 4, wherein the controlling means obtains the number of bytes in information data of a codeword from a length of codeword n and the error correcting capacity t through an equation $k=n-2t$, calculates the number M of entire codeword by dividing the total number of bytes in burst data by the obtained number k and outputs a corresponding control signal.

9. The programmable error correcting device as recited in claim 8, wherein the preprocessing means counts the outputting of the divided information data and determines a last information data if the counted value is matched to a total number codeword M inputted from the controlling means.

10. The programmable error correcting device as recited in claim 4, wherein the preprocessing means inserts zero values in the last information data when a shortened codeword mode is supported.

11. The programmable error correcting device as recited in claim 10, wherein the preprocessing means inserts zero values in the last information data to have the k bytes of information data in a last codeword.

12. The programmable error correcting device as recited in claim 10, wherein the preprocessing means inserts zero values in the last information data to have a predetermined bytes k' of information data in a last codeword.

* * * * *